United States Patent [19]

Hill et al.

[11] 3,737,672

[45] June 5, 1973

[54] LOW-LEVEL LOGIC PROTECTION INTERFACE

[75] Inventors: Frank W. Hill, Moline, Ill. Garland E. Fieser, East Moline, Ill.

[73] Assignee: Gulf & Western Industries, Inc., New York, N.Y.

[22] Filed: June 4, 1971

[21] Appl. No.: 150,016

[52] U.S. Cl. ..................307/202, 307/208, 307/237, 307/259, 307/318, 317/33 R, 328/171

[51] Int. Cl.........H02h 7/20, H03k 5/08, H03k 17/74

[58] Field of Search......................307/202, 203, 208, 307/204, 213, 218, 237, 256, 259, 264, 297, 317, 318, 285; 328/165, 171, 259, 262; 317/33 R

[56] References Cited

UNITED STATES PATENTS

| | | | |
|---|---|---|---|
| 2,965,767 | 12/1960 | Wanlass | 307/285 X |
| 3,581,107 | 5/1971 | Nielsen | 307/215 |
| 3,430,065 | 2/1969 | Cricchi | 307/318 X |
| 3,333,113 | 7/1967 | Cole et al. | 307/208 X |
| 3,341,713 | 9/1967 | Shaffer et al. | 307/318 X |
| 3,400,277 | 9/1968 | Bruckner | 307/264 |
| 3,422,282 | 1/1969 | Orrell, Jr. | 307/203 |
| 3,428,824 | 2/1969 | Linardos et al. | 307/218 X |
| 3,440,639 | 4/1969 | Sander et al. | 307/218 X |
| 3,529,179 | 9/1970 | Orrell, Jr. | 307/237 |
| 3,440,440 | 4/1969 | Prohofsky et al. | 307/218 X |

OTHER PUBLICATIONS

Arrasmith, "DC Voltage Sensing Circuit," IBM Technical Disclosure Bulletin, p. 1651, Vol. 12, No. 10, 3/1970.

Millman & Halkias, Electronic Devices and Circuits, pps. 606–607, McGraw-Hill, Inc., 1967.

*Primary Examiner*—John W. Huckert
*Assistant Examiner*—L. N. Anagnos
*Attorney*—Meyer, Tilberry & Body

[57] ABSTRACT

A low-level logic protection interface deriving operating potential from alternating-current line voltage is provided for coupling low-voltage, direct-current, detector signals of the order of zero to 12 volts, for example, to solid state control circuits. The interface serves to provide at least 12 volts noise immunity in such control circuits and to protect the control circuits against damage by the accidental connection of the alternating-current line as well as to protect against momentary high voltage transients. An inverter integrated circuit and an output transistor are provided with a back-biased diode and a zener diode interposed in the input to the inverter integrated circuit. Consequently, with a high positive input from the alternating-current line circuit, the output transistor cannot be turned on. With high positive input the diode is back-biased and with negative input the voltage applied to the zener diode is too low to cause the zener diode to conduct.

4 Claims, 4 Drawing Figures

INVENTOR.
FRANK W. HILL
GARLAND E. FIESER
BY
*Meyer, Tilberry & Body*
ATTORNEYS

INVENTOR
FRANK W. HILL
GARLAND E. FIESER
BY
Meyer, Tilberry & Body
ATTORNEYS

LOW-LEVEL LOGIC PROTECTION INTERFACE

Various arrangements have been proposed in solid state electronic control circuits to avoid problems resulting from electrical noise voltage pulses. For example, various arrangements of zener diodes or back-biased diodes to achieve noise immunity have been proposed as in Cricchi U.S. Pat. No. 3430065, Painter U.S. Pat. No. 3402303, and Orrell U.S. Pat. Nos. 3422282 and 3529179. Witsell U.S. Pat. No. 3491251 discloses a logic circuit for noise immunity capability which exceeds one half the logic swing in both directions.

In accordance with the present invention, malfunction or circuit damage from electrical noise voltage pulses is prevented. In addition, in accordance with the invention, protection is provided against circuit malfunction of voltage excursions of excessive value in the case of direct current and also in the case of excessive alternating-current line potential reaching the circuits in question. In the specific circuit shown by way of illustration for 12-volt, direct-current apparatus, there will be no malfunction for direct-current voltages up to 12 volts positive and the circuit will not be damaged even if an alternating-current line is directly connected to it. The specific circuit illustrated is designed for supply of traffic controllers which operate at 12 volts.

In solid state equipment such as solid state traffic controllers, for example, there are inputs directly into integrated circuits or transistors which are normally at a positive potential. A binary "zero" signal placed on this input causes a change in logic within the solid state system. As a result of this type of control, a high positive or negative voltage spike can damage or destroy the solid state input. Low-level noise on the input can cause false logic switching. The hot or high side of the alternating-current line, if connected to the input, would destroy or damage the solid state input.

It is accordingly, an object of the invention to avoid damage or destruction from high positive or negative voltage spikes, to eliminate the effect of low-level noise and to prevent destruction or damage from accidental connection of the hot or high side of the alternating-current line to the input to the solid state control.

In accordance with the invention, an interface is provided which obtains its operating potential directly from the alternating-current line, provides noise immunity and protects against damage by accidental connection of the hot alternating-current line and protects against momentary high voltage transients.

The interface includes a diode connected to an alternating-current line such as a conventional 120 volt, 60Hz line with a connection to a pair of back-to-back diodes, one of which is connected to the detector input terminal and the other of which is connected through a zener diode and an inverter to the base of an output transistor. A better understanding of the invention will be afforded by the following detailed description considered in conjunction with the accompanying drawings in which.

Like reference characters are utilized throughout the drawings to designate like parts.

Figure 1:
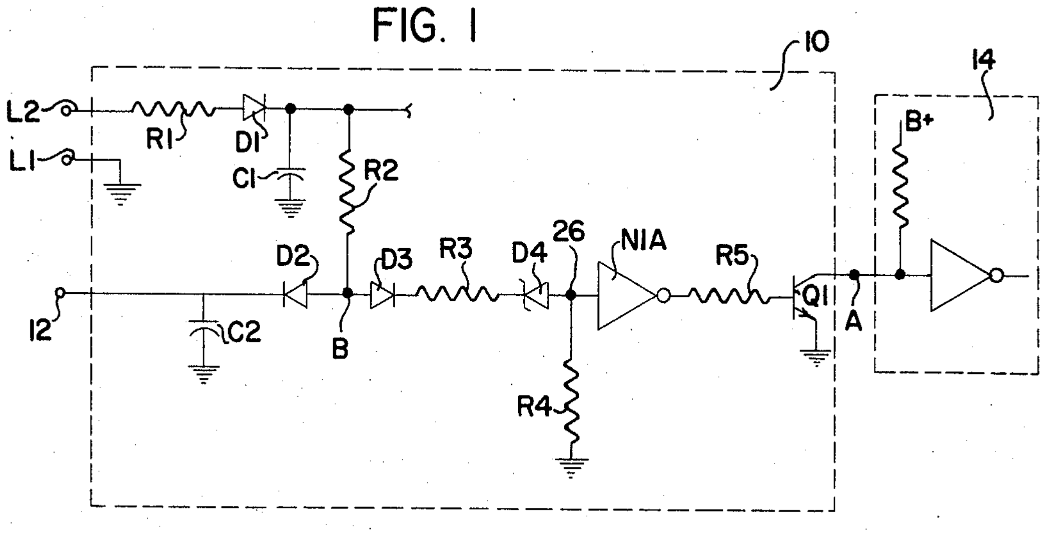
FIG. 1 is a circuit diagram of an interface forming an embodiment of the invention.

In the embodiment illustrated in FIG. 1, a detector interface illustrated within the dashed rectangle 10 is interposed between a detector terminal 12 and the input at terminal A to a solid state controller or logic circuit schematically represented fragmentarily within a rectangle 14. A 120 volt, alternating-current supply for the interface 10 is provided having a grounded terminal L1 and a "hot" or high side terminal L2. There is an output transistor Q1 having its collector connected to the solid-state controller input terminal A, its emitter grounded and its base coupled to the input terminal 12. As shown, the transistor Q1 is of the NPN type.

For supplying operating potential to the interface 10 at a terminal B, the terminal B is connected to the alternating-current supply terminal L2 through a resistor R1, a diode D1 and a resistor R2. For smoothing the direct-current potential provided by the diode D1, a capacitor C1 is connected between ground and the junction point 16 of the diode D1 and the resistor R2. The base of the transistor Q1 is coupled to the input terminal 12 through an inverter N1A.

Back-to-back diodes D2 and D3 are provided with their anodes connected to the terminal B, the cathode of the diode D2 being connected to the detector input terminal 12 and the cathode of the diode D3 being connected to the input terminal of the inverter N1A through a resistor R3 and a zener diode D4. The anode of the zener diode D4 is connected as shown to the input of the inverter N1A, which is also coupled to ground through a resistor R4. A resistor R5 is interposed between the output of the inverter N1A and the base of the NPN transistor Q1.

OPERATION

For the sake of explanation, it may be assumed that the schematically represented circuit 14 is a solid state traffic control circuit such as for turning on or off a traffic signal lamp and the detector input terminal 12 is the terminal of, or connection to, a traffic detector. In its simplest form, the traffic detector may be a switch which closes to connect the terminal 12 to ground when a vehicle is detected and is otherwise open. It is assumed that the terminal A of the control 14 is normally at positive potential and that its mode of operation is that a binary zero signal placed thereon causes a change in logic within the solid state system to operate the traffic signal in the desired manner. When traffic is detected, a binary zero signal is applied to the input terminal 12. With input at a potential of ground to 12 plus or minus 1 volt, the diode D2 will form a parallel circuit to diode D3, resistor R3, diode D4 and inverter N1A. The potential available at the cathode of the zener diode D4 is not high enough to cause the zener diode to conduct. Consequently, the inverter N1A is turned off and the transistor Q1 is turned on. With the transistor Q1 turned on, its collector is connected substantially to ground and the point A is at ground potential to activate the controller 14.

The arrangement is such that when any potential from ground to 12 volts plus or minus 1 volt is applied to the input terminal 12, the point A will be at zero, but when any potential higher than 12 plus or minus 1 volt is applied to the input terminal 12, point A will be at a binary one or positive potential.

Circuit protection for the control circuit 14 is achieved in the following manner. When no input signal is applied the potential at the input terminal 12 will be 25 plus or minus 1 volt with the circuit values selected for operation of a 12 volt solid state control circuit. Owing to the diode drop, the potential at point B will be 26 plus or minus 1 volt. Thus, with no input applied, full potential 26 plus or minus 1 volt is applied to the anode of the diode D3. Current passes through the elements D3, R3, D4 to turn on the inverter N1A. With the inverter N1A turned on, Q1 cannot be on, the point A will remain at a positive potential.

On the other hand, with input at a potential of ground to 12 plus or minus 1 volt the diode D2 will form a parallel circuit with the elements D3, R3, D4 and the inverter N1A. Under this circumstance, the potential available at the cathode of the zener diode D4 is not high enough to cause the zener diode D4 to conduct. Consequently, the inverter N1A is off and the transistor Q1 is turned on. With the transistor Q1 turned on, the point A is at ground potential.

If voltage from the "hot" alternating-current terminal L2 should become applied to the input terminal 12, the point A will be alternately at plus or ground depending upon the alternation of the alternating current at the input. However, no damage to the circuit can take place. When the alternating-current input is positive, the diode D2 is back-biased. On the other hand, when the alternating current is negative, the diode D2 will form the same parallel path previously described, leaving the point A at ground potential. Momentary high voltage spikes or high voltage transients will have the same effect as positive or negative waves of alternating current so that the circuit is also protected against such spikes or transients. Noise signals of 12 volts or more will have no effect since as previously explained, when the signal at the input exceeds 12 plus or minus 1 volts, the point A remains at positive potential.

OTHER EMBODIMENTS

Figure 2:
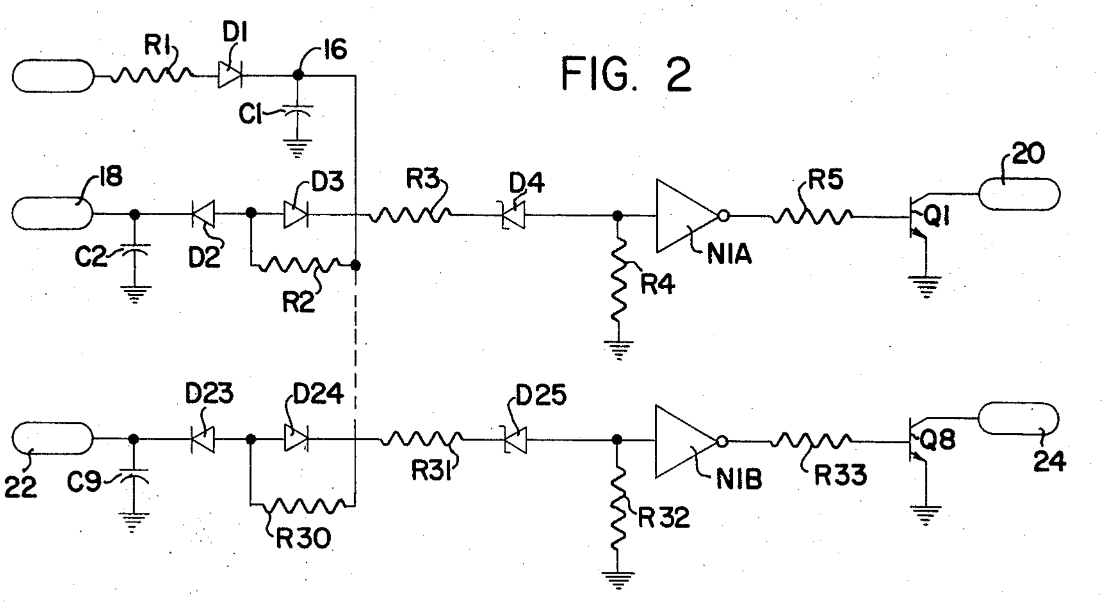
FIG. 2 is a diagram which illustrates the manner in which a plurality of solid-state control circuits may be interfaced with separate detector inputs but with a common alternating-current power supply and a single integrated circuit inverter.

FIG. 2 illustrates the manner in which an interface of the type illustrated in FIG. 1 may be used for the protection of a plurality of control circuits or low-level logics. Only one filtered power supply is required for all of the interfaces. A single diode D1 with a single filter resistor R1 and capacitor C1 with a filtered output terminal 16 serves for all of the interfaces. Corresponding to the circuitry of FIG. 1 is an interface with a detector input terminal 18 and a detector output terminal 20. For the sake of simplicity in drawing, only one other interface has been shown with a detector input terminal 22 and an output terminal 24 with elements C9, D23, D24, R30, R31, D25, R32, N1B, R33 and Q8, corresponding to the elements C2, D2, D3, R2, R3, D4, R4, N1A, R5 and Q1, respectively, of FIG. 1. If the inverter employed is of the integrated circuit type, having a plurality of input and output pins, a single integrated circuit unit may be employed for as many as eight different interfaces. For example, pin numbers 1, 2, 6 and 7 may be utilized as output terminals and pin numbers 14, 13, 9 and 8 may be used as input terminals of the inverter N1A constituting one half of such an integrated circuit and corresponding pins being employed as input and output terminals of inverters N1B corresponding to the other half of the integrated circuit.

Figure 3:
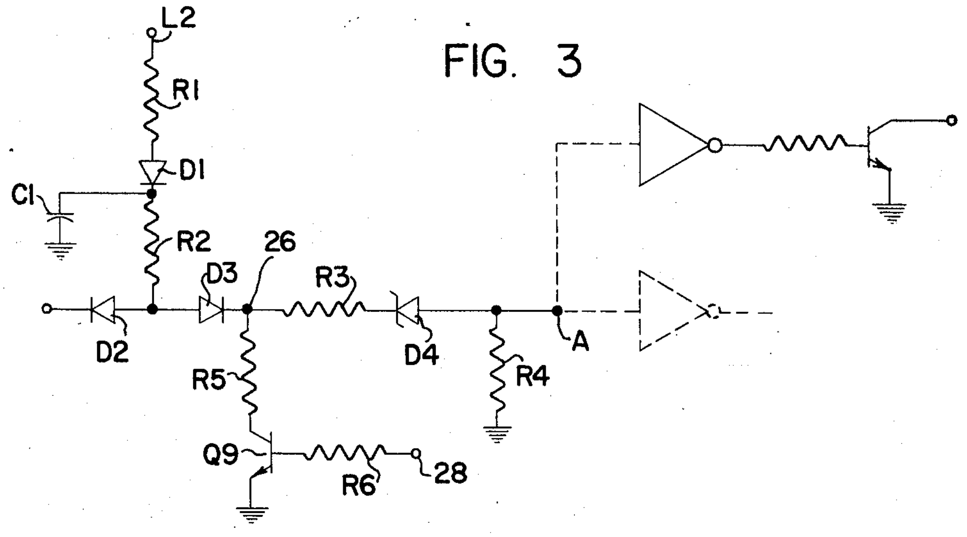
FIG. 3 is a circuit diagram of a modification in arrangement of FIG. 1; and, FIG. 4 is a circuit diagram of still another embodiment of the invention.

Although in the arrangement of FIGS. 1 and 2, the effect of double inversion has been obtained by the employment of both an inverter N1A and a common-emitter connected transistor Q1, the invention is not limited to this arrangement. It does not exclude the direct connection of the junction point 26 of the zener diode D4 and the coupling resistor R4 to the output terminal A, as illustrated, for example, in FIG. 3. In addition, in the arrangement of FIG. 3, the resistor R5 is connected to ground through the collector and emitter of a transistor Q9 having a base connected through a resistor R6 to a positive input terminal 28.

Figure 4:
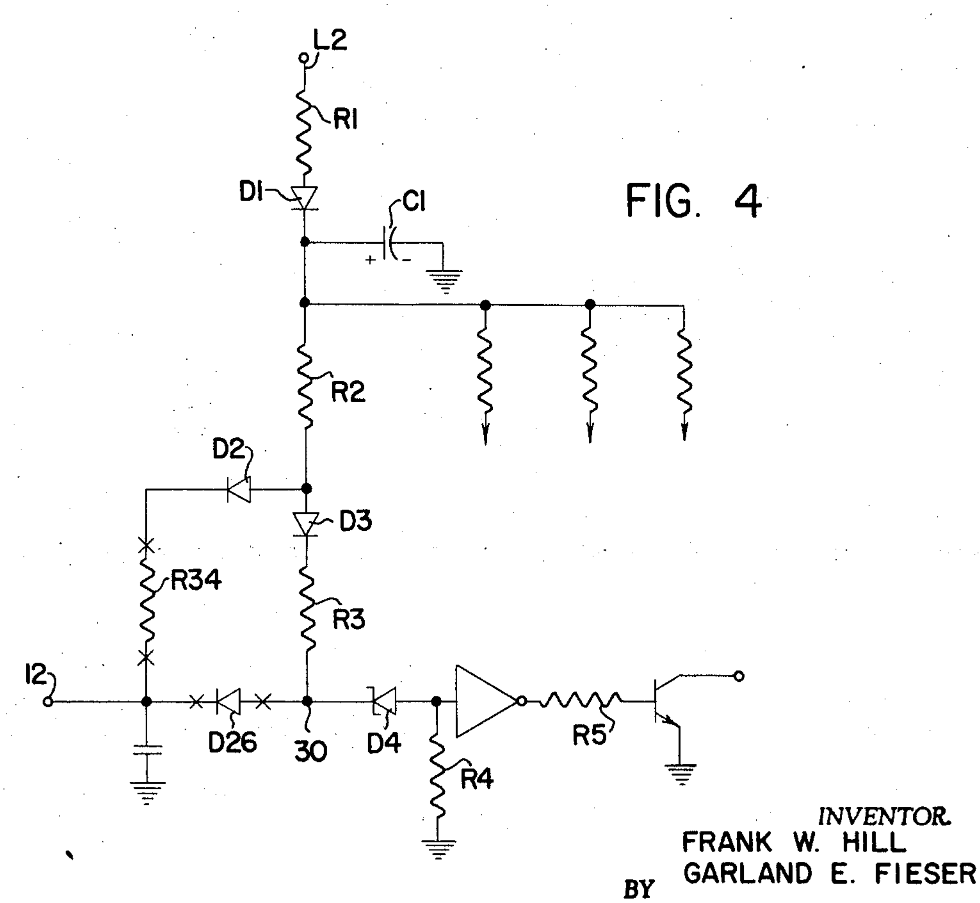

Another modification of the circuit which has been found satisfactory is illustrated in FIG. 4 in which a resistor R34 is interposed in the connection of the diode D2 to the input terminal 12 and an additional diode D26 is bridged across the elements R3, D3, D2 and R34 by connection from the input terminal 12 to a junction terminal 30 of the resistor R3 and the zener diode D4.

The invention is not limited to the use of specific solid state elements or specific circuit values, however, satisfactory results have been accomplished with values as follows:

| | | | |
|---|---|---|---|
| Resistors | | | Capacitors |
| R1 | 100 ohms, ½ watt | C1 | 12 microfarads, 250 volts |
| R2 | 100 kilohms | | |
| R3 | 12 kilohms | C2 | 1/10 microfarad, 500 volts |
| R4 | 4700 ohms | | |
| R5 | 2200 ohms | C9 | 1/10 microfarad, 500 volts |
| R6 | 1200 ohms | | |
| R30 | 100 kilohms | | Diodes |
| R31 | 12 kilohms | All | 1N 4005 |
| R32 | 4700 ohms | Zener Diodes D4 and D25 1N 4739 | |
| R33 | 2200 ohms | | |
| R34 | 12000 ohms | | Transistors |
| Resistors | | All | 2N 3567 |
| All, except where otherwise indicated, ¼ watt | | Integrated Circuit N1N1B Motorola Type MC 889 | |

Certain embodiments of the invention and certain methods of operation embraced therein have been shown and particularly described for the purpose of explaining the principle of operation of the invention and showing its application, but it will be obvious to those skilled in the art that many modifications and variations are possible, and it is intended therefore, to cover all such modifications and variations as fall within the scope of the invention.

What is claimed is:

1. A low-level logic protection circuit for driving first and second logic outputs with first and second logic signal inputs, said circuit including first and second interfaces, each of said interfaces comprising: first and second parallel branches, said first branch extending between a common point and an input signal terminal, said second branch extending between said common point and a fixed potential terminal, means coupling a selected point of said second branch to a device for creating one of said logic outputs, a first diode in said first branch poled to allow current flow in said first branch and from said common point, a second diode in said second branch for allowing current flow in said second branch and from said common point, limiting means in said second branch between said common point and said selected point for allowing current flow in said second branch only when voltage across said limiting means exceeds a predetermined value, and a resistor between said selected point and said fixed potential; and, a common power supply means including first and second input terminals adapted to be connected to an alternating-current power supply, a rectifier means connected to at least one of said terminals and having a direct current output lead, and circuit means for connecting said lead to each of said common points of said first and second interfaces.

2. The circuit as defined in claim 1 wherein said connecting circuit means includes a resistor between said lead and said common points of said first and second interfaces.

3. A circuit as defined in claim 1 wherein said limiting means is a zener diode having a break-down voltage corresponding with said predetermined value.

4. A circuit as defined in claim 1 wherein said first input terminal is grounded.

* * * * *